(12) United States Patent
Hachiya et al.

(10) Patent No.: US 7,581,313 B2
(45) Date of Patent: Sep. 1, 2009

(54) COMPONENT MOUNTING METHOD AND MOUNTER

(75) Inventors: Eiichi Hachiya, Fukuoka (JP); Tamaki Ogura, Saga (JP)

(73) Assignee: Panasonic Corporation, Osaka (JP)

( * ) Notice: Subject to any disclaimer, the term of this patent is extended or adjusted under 35 U.S.C. 154(b) by 217 days.

(21) Appl. No.: 11/667,334

(22) PCT Filed: Mar. 3, 2006

(86) PCT No.: PCT/JP2006/004677
§ 371 (c)(1),
(2), (4) Date: May 9, 2007

(87) PCT Pub. No.: WO2006/095841
PCT Pub. Date: Sep. 14, 2006

(65) Prior Publication Data
US 2007/0294875 A1  Dec. 27, 2007

(30) Foreign Application Priority Data
Mar. 10, 2005  (JP) ............... 2005/067189

(51) Int. Cl.
*H05K 3/30*  (2006.01)
*G01R 31/28*  (2006.01)
*G01B 11/14*  (2006.01)
(52) U.S. Cl. .............. 29/833; 29/832; 29/834; 29/593; 356/614; 356/615
(58) Field of Classification Search .......... 29/832–34, 29/593; 356/151, 237.1, 399, 614–15; 700/192–93, 700/213
See application file for complete search history.

(56) References Cited

U.S. PATENT DOCUMENTS

| 5,369,493 | A | 11/1994 | Tomita et al. |
| 6,211,958 | B1 * | 4/2001 | Hachiya et al. ............. 382/151 |
| 2004/0109172 | A1 * | 6/2004 | Nagao et al. ................ 356/615 |
| 2005/0235489 | A1 | 10/2005 | Okuda et al. |

FOREIGN PATENT DOCUMENTS

| JP | 10-256790 | 9/1998 |
| WO | 2004/026015 | 3/2004 |
| WO | WO2004/026015 | * 3/2004 |

* cited by examiner

*Primary Examiner*—A. Dexter Tugbang
*Assistant Examiner*—David P Angwin
(74) *Attorney, Agent, or Firm*—Wenderoth, lind & Ponack, LLP.

(57) ABSTRACT

The present invention, which aims at providing a component mounting method and a mounter capable of correcting, with high accuracy, a mounting position of a component, includes: a mounting head (105); a recognition unit (108) including a shutter camera (111*b*) and instructing it to start taking an image of a component (103*a*) when the mounting head (105) arrives at a predetermined position; and a main control unit (160) (i) correcting a position of the component shown in the image taken by the shutter camera (111*b*), based on a first distance over which the mounting head (105) moves during a time period from when the instruction to start taking the image is given to when camera exposure by the shutter camera (111*b*) is performed, (ii) correcting the mounting position at which the mounting head (105) is to mount the component (103*a*), based on the corrected component position, and (iii) controlling the mounting head (105) so that it mounts the component (103*a*) at the corrected mounting position.

6 Claims, 12 Drawing Sheets

COMPONENT MOUNTING METHOD AND MOUNTER

TECHNICAL FIELD

The present invention relates to a component mounting method and a mounter, and particularly to a component mounting method and a mounter for correcting a mounting position at which a component is to be mounted at the time of component mounting.

BACKGROUND ART

A component mounting apparatus (mounter) is one of the conventional apparatuses that mount electronic components (hereinafter simply referred to also as "component(s)") onto a board. In a component mounting apparatus, a mounting head picks up a component from a component supply apparatus such as a tape feeder, and delivers and mounts such component onto a board. In response to the demand for improved accuracy in the component mounting performed by such component mounting apparatus, there exists a component mounting apparatus which is equipped with a recognizing means that recognizes the state of a component held on a mounting head and which corrects the mounting position at which the component is to be mounted at the time of component mounting (such position is hereinafter simply referred to also as a "mounting position"), based on the result of the recognition performed by the recognizing means.

FIG. 1 is an external view showing a conventional electronic component mounting apparatus (e.g., refer to Japanese Laid-Open Patent application No. 10-256790).

Such electronic component mounting apparatus 201 is comprised of: a transportation path 202 for transporting a board 202a and determining the position thereof; a tray 203 on which components 203a are stored; a tray feeder 204 for automatically delivering the tray 203 to a predetermined position; a mounting head 205 for picking up by suction a component 203a from the tray 203 and mounting it onto the board 202a; an X-axis moving means 206 for moving the mounting head 205 along the X-axis direction; and two Y-axis moving means 207a and 207b for moving the mounting head 205 along the Y-axis direction; and a recognizing means 208 for recognizing the state of the electronic component 203a held on the mounting head 205.

The recognizing means 208 includes a Charge-Couple Devices (CCD) shutter camera or a Metal-Oxide Semiconductor (MOS) shutter camera, each taking an image of the component 203a while it is moved just above the recognizing means 208 in the direction of the X-axis. The amount of displacement with respect to the central position of the component is thereby detected, the central position being a position at which the component 203a should be held on the mounting head 205 (such position is hereinafter referred to simply as the "central position"). Based on the amount of displacement recognized by the recognizing means 208, the electronic component mounting apparatus 201 corrects the position of the mounting head 205 at the time of mounting the electronic component 203a, and then mounts the component 203a onto the board 202a. This enables the mounting of the component 203a at a predetermined position on the board 202a with high accuracy. When this is done, since the image of the component 203a is taken while the component 203a is moving, cycle time, which is the time required from when the component 203a is picked up to when it is mounted onto the board 202a, does not become longer.

DISCLOSURE OF INVENTION

Meanwhile, in the conventional electronic component mounting apparatus, when the mounting head arrives at a position at which the recognizing means starts recognition (hereinafter referred to as a "recognition start position"), a Z phase signal for instructing the shutter camera to start taking an image is outputted, as shown in the timing chart of FIG. 2. After this Z phase signal is outputted, camera exposure is started in response to the output of a reset signal (which is directed to vertical synchronization (VD)) in synchronization with a horizontal synchronization (HD) control signal directed to the shutter camera. Thus, a travel distance (which is indicated as a range "a" in FIG. 2), detected by a movement signal (A/B phase signal), over which the mounting head has moved during a time period from when it arrives at the recognition start position to when camera exposure is started, varies depending on the timing at which a vertical synchronization control signal is outputted. As a result, in the conventional electronic component mounting apparatus, since the recognizing means cannot correctly recognize the state of the component held on the mounting head, that is, the recognizing means incorrectly recognizes a travel distance of the mounting head as the amount of displacement of the component with respect to the central position of the mounting head, such conventional recognizing means cannot correct the mounting position of a component with high accuracy.

Here, referring to FIGS. 3A to 3C, a description is given of the reason why a reset signal is outputted in synchronization with a horizontal synchronization control signal. The shutter camera captures an image projected onto it by scanning it in horizontal and vertical directions. In so doing, the shutter camera performs the scanning of a horizontal line in synchronization with a horizontal synchronization control signal (FIG. 3A), and goes onto the next line at the completion of the scanning of one line (FIG. 3B). By repeating such horizontal scanning, the shutter camera performs vertical scanning (FIG. 3C). For this reason, in order to capture an image successfully, such scanning needs to be reset at the start of camera exposure, so that the above horizontal and vertical scanning is performed in response to the first horizontal synchronization signal that is outputted after the reset operation duration (which is the time required to perform a reset operation including the time required for shutter on and off of the camera, and is normally in the range between one to several HD (horizontal synchronization signals) depending on the type of the camera). However, while vertical scanning is resettable, horizontal scanning cannot be reset at an arbitrary timing, since horizontal scanning is performed in synchronization with a horizontal synchronization control signal. This is why vertical scanning needs to be reset at the timing when horizontal scanning starts from one end of each horizontal line, so as to start camera exposure.

Moreover, in the conventional electronic component mounting apparatus, the shutter camera starts taking an image of a component after waiting for such component to move at a constant sped, in consideration of the subsequent process to be performed on the image taken by the shutter camera. For this reason, the shutter camera cannot start taking an image of a component until the moving speed of such component becomes constant. As a result, the conventional electronic component mounting apparatus cannot achieve a reduced cycle time since the recognizing means takes much time for component recognition.

The present invention has been conceived in view of the above problems, and it is a first object of the present invention to provide a component mounting method and a mounter capable of correcting the mounting position of a component with high accuracy at the time of component mounting.

A second object of the present invention is to provide a component mounting method and a mounter capable of reducing a cycle time.

In order to achieve the above objects, the component mounting method according to the present invention is a component mounting method for use by a mounter having a mounting head that holds and moves a component so as to mount the component onto a board, the method comprising: giving an instruction for a camera to start taking an image of the component held on the mounting head, based on a position of the mounting head; starting camera exposure by the camera in response to the instruction; obtaining a movement amount by which the mounting head moves during a time period from when the instruction is given to when the camera exposure is performed; obtaining a position of the component based on the movement amount and the image taken by the camera; correcting a mounting position at which the mounting head is to mount the component, based on the obtained position of the component; and mounting the component, whose image has been taken by the camera, at the corrected mounting position. Here, in the obtaining of the position of the component, the position of the component shown in the image may be corrected based on the movement amount.

This structure makes it possible to correctly recognize the state of the component held on the mounting head, and thus to correct the mounting position of the component with high accuracy.

The above component mounting method may further include ending the camera exposure after a predetermined lapse of time from when the camera exposure is started, wherein in the obtaining of the movement amount, a first distance and a second distance may be obtained, the first distance being a distance over which the mounting head moves during a time period from when the instruction is given to when the camera exposure is started, and the second distance being a distance over which the mounting head moves during a time period from when the instruction is given to when the camera exposure is ended, and in the obtaining of the position of the component, the position of the component shown in the image taken by the camera may be corrected based on the first distance and the second distance.

This structure makes it possible to shorten the cycle time since it is possible for the camera to start taking an image used for correcting the mounting position of the component, even while the mounting head is moving at an accelerated speed, without needing to wait for such mounting head to move at a constant speed.

Note that not only it is possible for the present invention to be embodied as the above-described component mounting method, but also as a mounter and a program for mounting a component by use of the above-described component mounting method, and as a storage medium that stores such program.

According to the component mounting method and the mounter of the present invention, it is possible to: correct the mounting position of a component; reduce the cycle time; and perform component recognition for correcting the mounting position of the component with high accuracy, regardless of the size of components.

The disclosure of Japanese Patent Application No. 2005-67189 filed on Mar. 10, 2005 including specification, drawings and claims is incorporated herein by reference in its entirety.

BRIEF DESCRIPTION OF DRAWINGS

These and other objects, advantages and features of the invention will become apparent from the following description thereof taken in conjunction with the accompanying drawings that illustrate a specific embodiment of the invention. In the Drawings.

BEST MODE FOR CARRYING OUT THE INVENTION

The following describes the mounter according to an embodiment of the present invention with reference to the drawings.

Figure 1:
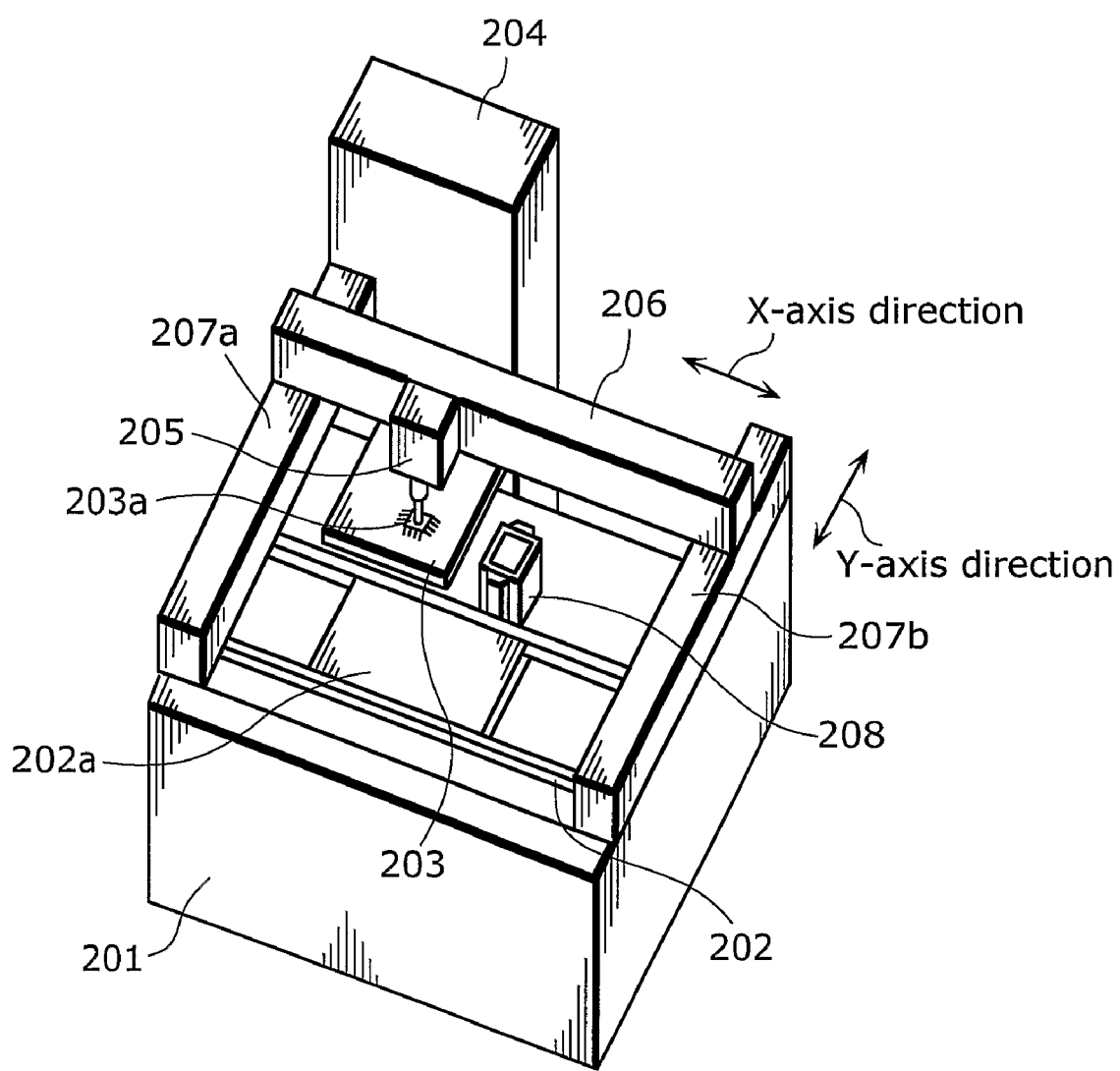
FIG. 1 is an external view showing a conventional electronic component mounting apparatus.
Figure 2:
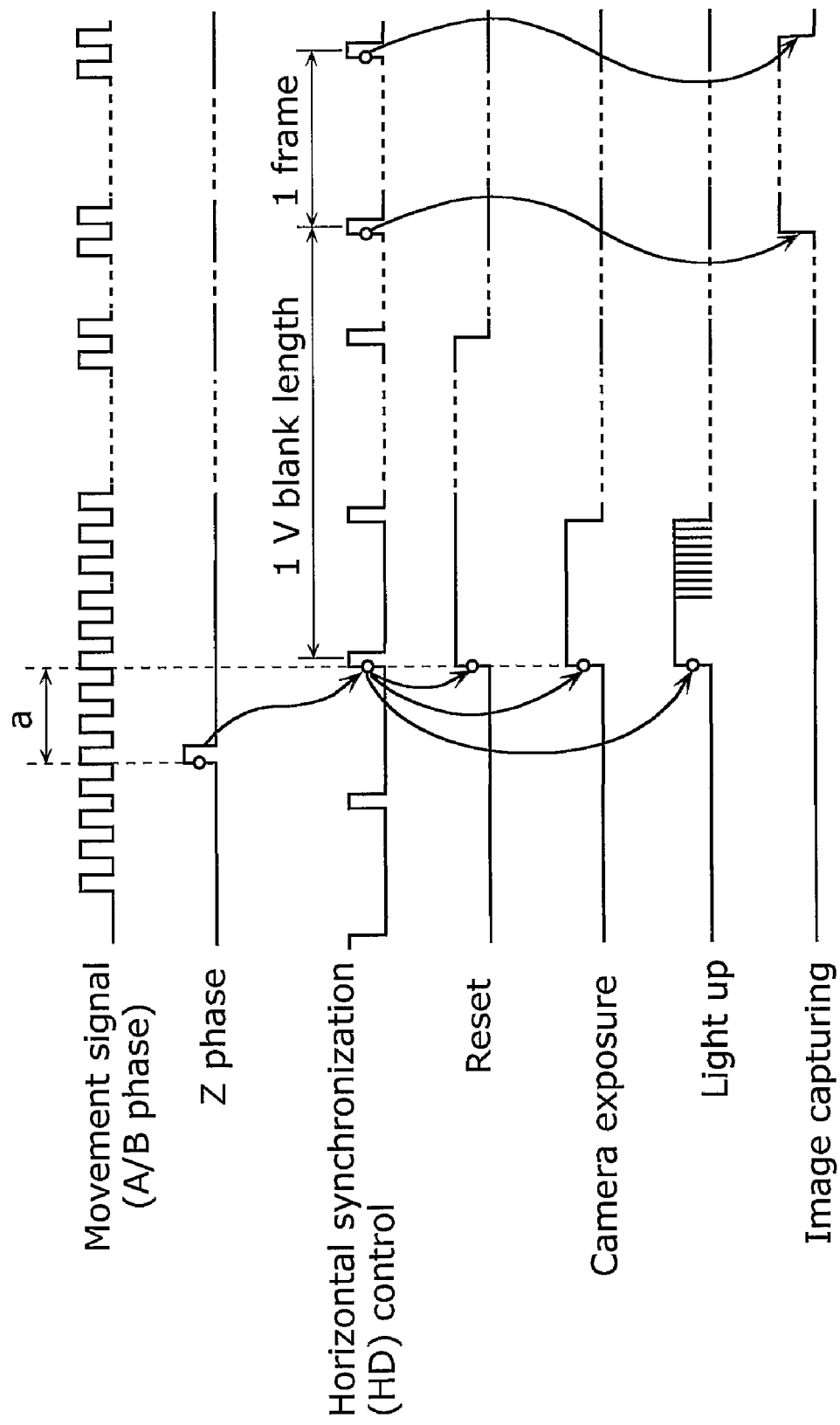
FIG. 2 is a timing chart showing operations, for recognizing a component, performed by a recognizing means of the conventional electronic component mounting apparatus.
Figure 3A:
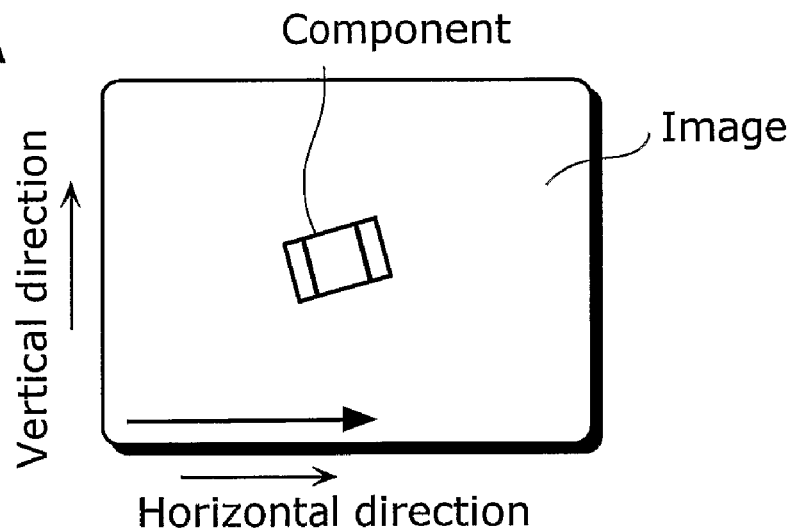
FIG. 3A is a diagram for describing the reason why a rest signal is outputted in synchronization with a horizontal synchronization control signal.
Figure 3B:
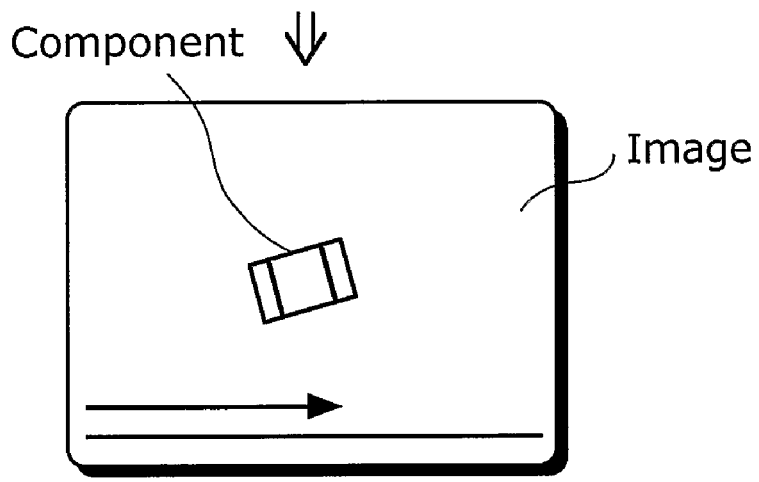
FIG. 3B is a diagram for describing the reason why a rest signal is outputted in synchronization with a horizontal synchronization control signal.
Figure 3C:
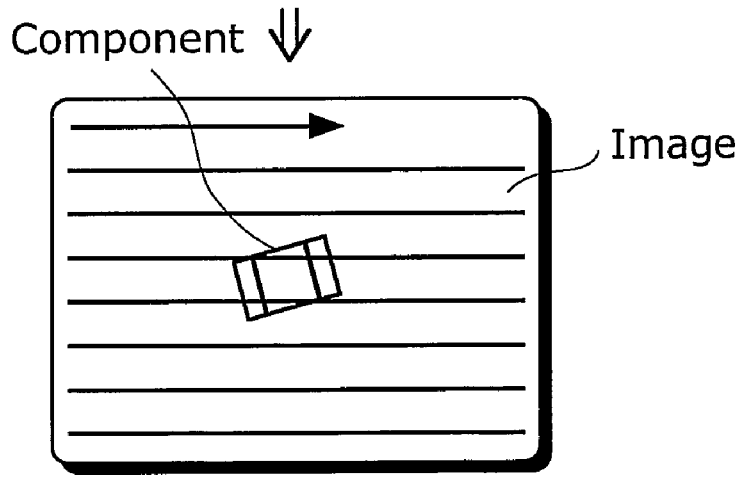
FIG. 3C is a diagram for describing the reason why a rest signal is outputted in synchronization with a horizontal synchronization control signal.
Figure 4:
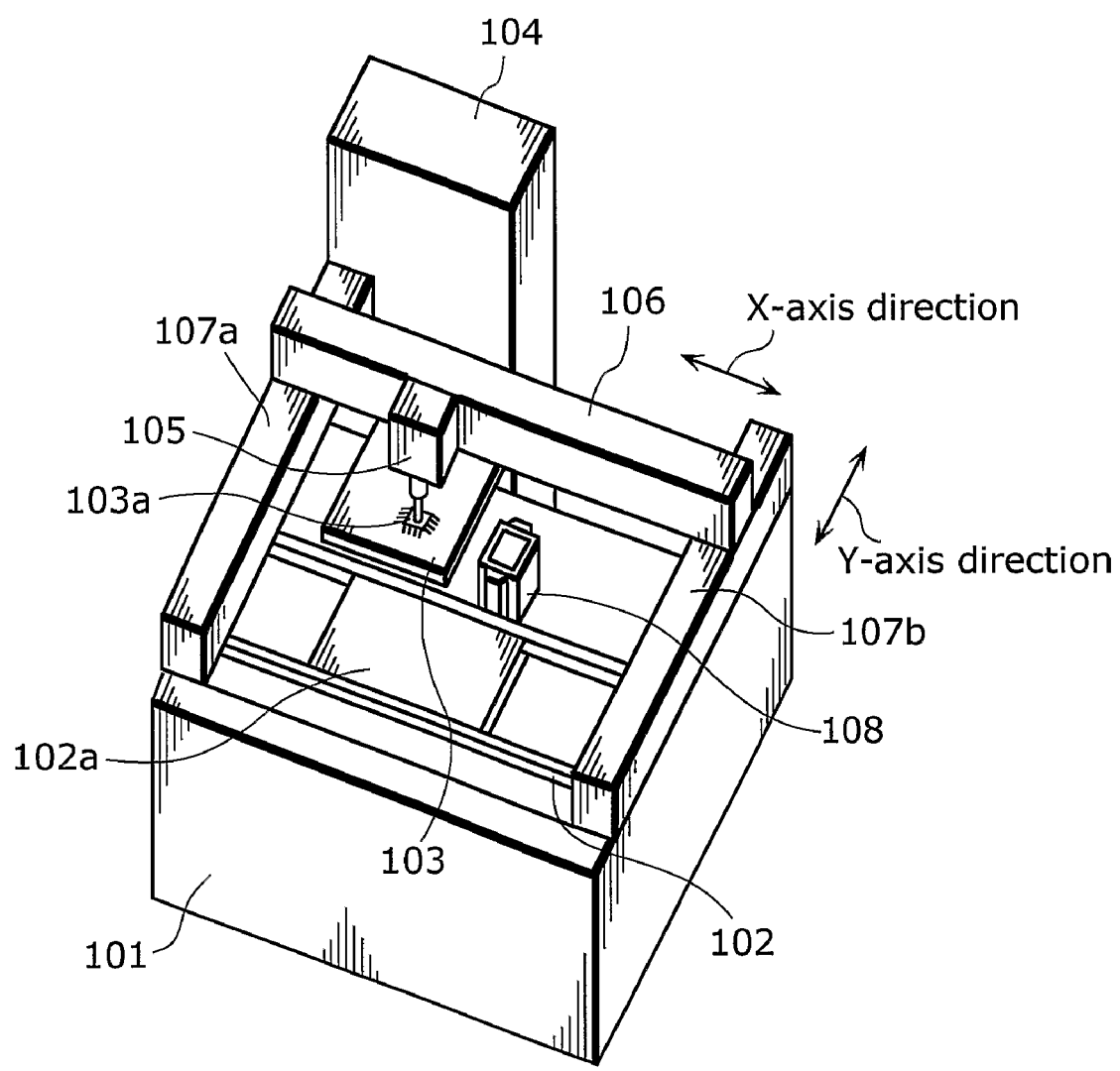
FIG. 4 is an external view showing a mounter according to an embodiment of the present invention.

FIG. 4 is an external view showing the mounter of the present embodiment.

The mounter 101 is comprised of: a transportation path 102 for transporting a board 102a and determining the position thereof; a tray 103 on which components 103a are stored; a tray feeder 104 serving as a component supply unit for automatically delivering a tray 103 to a predetermined position; a mounting head 105 for picking up by suction a component 103a from the tray 103 and mounting it onto the board 102a; an X-axis moving unit 106 for moving the mounting head 105 along the X-axis direction; and Y-axis moving units 107a and 107*b* for moving the mounting head 105 along the Y-axis direction; and a recognition unit 108 for recognizing the state of the component 103*a* held on the mounting head 105.

Figure 5:
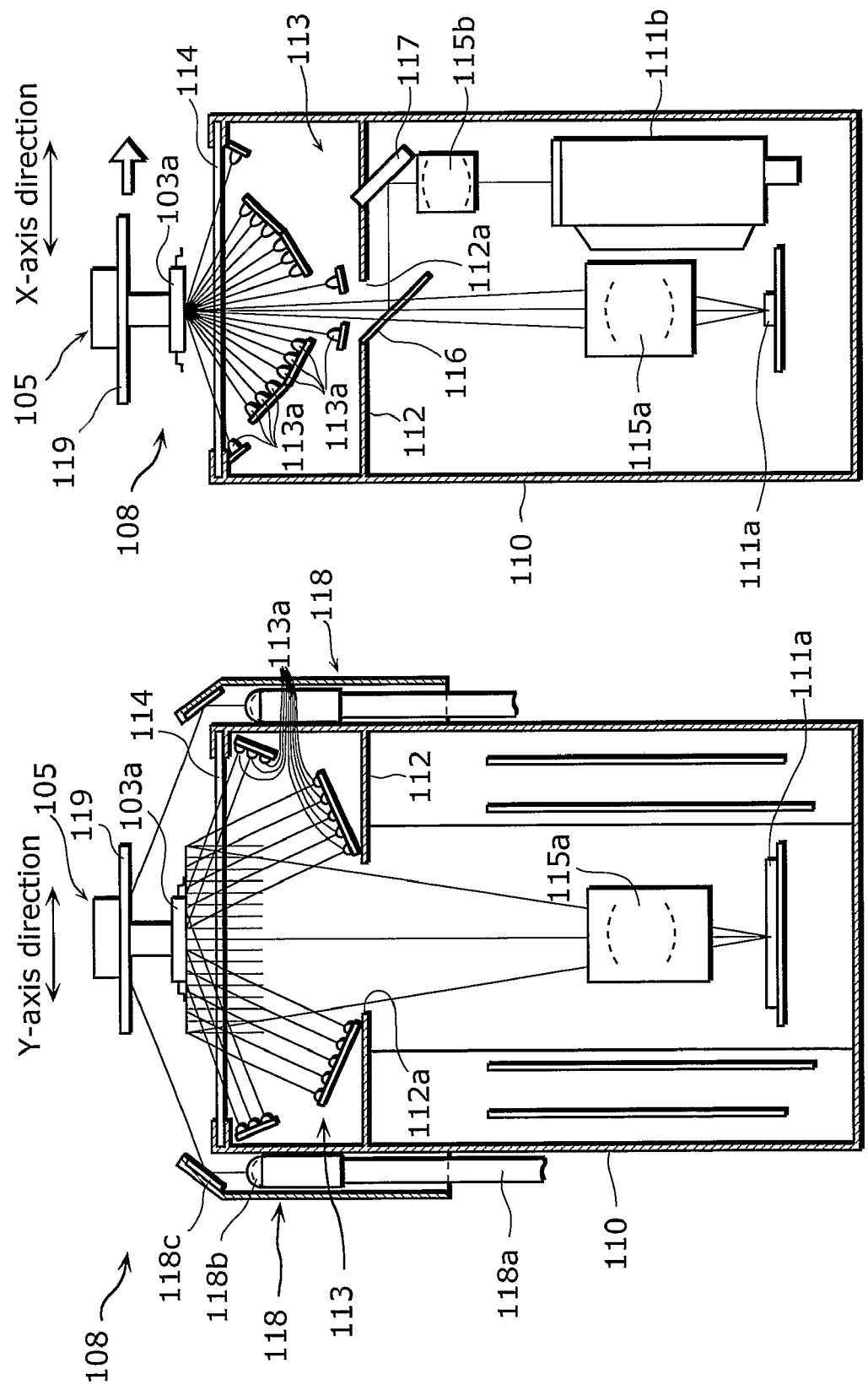
FIG. 5A is a cross-sectional view showing the structure of a recognition unit (along a Y-axis direction in FIG. 4)
FIG. 5B is a cross-sectional view showing the structure of a recognition unit (along an X-axis direction in FIG. 4)

FIG. 5A and FIG. 5B are cross-sectional views, each showing the structure of the recognition unit 108, of which FIG. 5A is a cross-sectional view showing the recognition unit 108 along the Y-axis direction in FIG. 4, and FIG. 5B is a cross-sectional view showing the recognition unit 108 along the X-axis direction in FIG. 4.

The recognition unit 108 includes: a rectangular parallelepiped casing 110; a CCD line camera 111*a* and a shutter camera 111*b* that are placed inside the casing 110 side by side in the X-axis direction; a partition 112; a illumination chamber 113; a transparent glass plate 114 that covers the top of the casing 110; a focusing lens system 115*a* placed above the line camera 111*a*; a focusing lens system 115*b* placed above the shutter camera 111*b*; a half mirror 116 that is mounted under a slot 112*a*, which is formed in the partition 112, at an angle of 45 degrees with respect to an optical axis of the focusing lens system 115*b*; a mirror 117 that is mounted above the focusing lens system 115*b* at an angle of 45 degrees with respect to the optical axis in a manner that such mirror 117 opposes the half mirror 116; and a floodlighting units 118 that are placed at both sides of the casing 110.

The partition 112 has an oblong slot 112*a*, which extends along the Y-axis direction, for allowing an image of the component 103*a* held on the mounting head 105 to enter the line camera 111*a* and the shutter camera 111*b*. The image of the component 103*a* is taken through such slot 112*a* for focusing the image linearly on the line camera 111*a* (in the Y-axis direction) by the focusing lens system 115*a*. Similarly, the image taken through the slot 112*a* is guided by the half mirror 116 and the mirror 117 to the focusing lens system 115*b* for focusing the image linearly on the shutter camera 111*b*.

Placed in the illumination chamber 113 are a plurality of light emitting diodes (LEDs) 113*a* for emitting lights toward the component 103*a* from various angles. The LEDs 113*a* are placed inside the illumination chamber 113 in a manner that they do not interfere with an image of the component 103*a* entering the line camera 111*a* and the shutter camera 111*b*. Lights from the LEDs 113*a* are reflected at the bottom surface of the component 103*a* to be collected at the respective focusing points of the line camera 111*a* and the shutter camera 111*b*.

The floodlighting units 118 each include: an optical fiber 118*a*; a projector lens 118*b* attached at the top of the optical fiber 118*a*; and a mirror 118*c* that guides light from the optical fiber 118*a* to be reflected to a reflector 119 equipped at the mounting head 105. The lights from the floodlighting units 118 reflected by the respective mirrors 118*c* are reflected at the reflector 119 to irradiate the component 103*a* from above.

Figure 6:
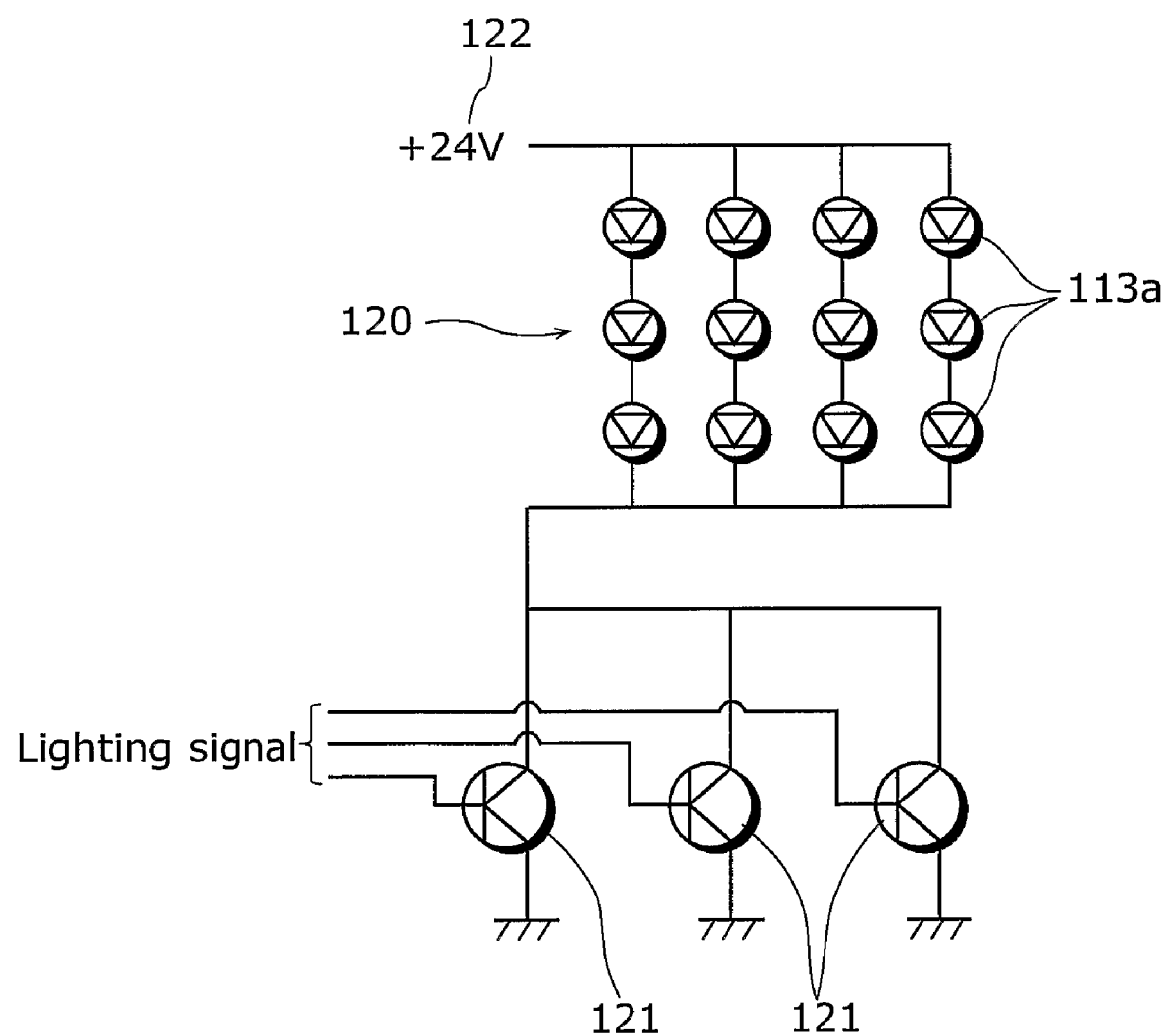
FIG. 6 is a diagram showing a lighting control circuit for controlling the lighting of LEDs.

FIG. 6 is a diagram showing a lighting control circuit for controlling the lighting of the LEDs 113*a*.

In this lighting control circuit, a plurality of switching elements 121 are connected in parallel with a LED unit 120, which is formed by plural arrays of serial-connected LEDs 113*a* that are connected in parallel. Such parallel-connected LED unit 120 and switching elements 121 are connected between a power source 122 (24V) and the ground. The amount of light in the illumination chamber 113 is controlled by controlling the number of switching elements 121 to be brought into conduction, according to a lighting signal. More specifically, in the case of taking an image by the shutter camera 111*b*, a large amount of light is instantaneously needed, and thus a large amount of current is applied to the LED unit 120 by bringing all the switching elements 121 into conduction for a short period of time, so as to cause the LEDs 113*a* to emit lights with a high intensity. In the case of taking an image by the line camera 111*a*, it is necessary to irradiate light to the component 103*a* while such component 103*a* is moving above the recognition unit 108, and thus a current is applied to the LED unit 120 by bringing a small number of switching elements 121 (one or two) into conduction for a long period of time, so as to cause the LEDs 113*a* to emit lights for a long period of time.

In the mounter 101 with the above structure, the recognition unit 108 recognizes the position and the shape of the component 103*a* held on the mounting head 105 while such component 103*a* is moving just above the recognition unit 108 in the X-axis direction. The amount of displacement with respect to the central position of the component 103*a* held on the mounting head 105 is thereby detected, the central position being a position at which the component 203*a* should be held on the mounting head 205 (such position is hereinafter referred to simply as the "central position"). Based on the amount of displacement detected by the recognition unit 108, the mounter 101 corrects a position at which the component 103*a* is to be mounted at the time of component mounting (such position is hereinafter simply referred to also as a "mounting position"), and then mounts the component 103*a* onto the board 102*a*. This enables the mounting of the component 103*a* at a predetermined position on the board 102*a* with high accuracy.

Figure 7:
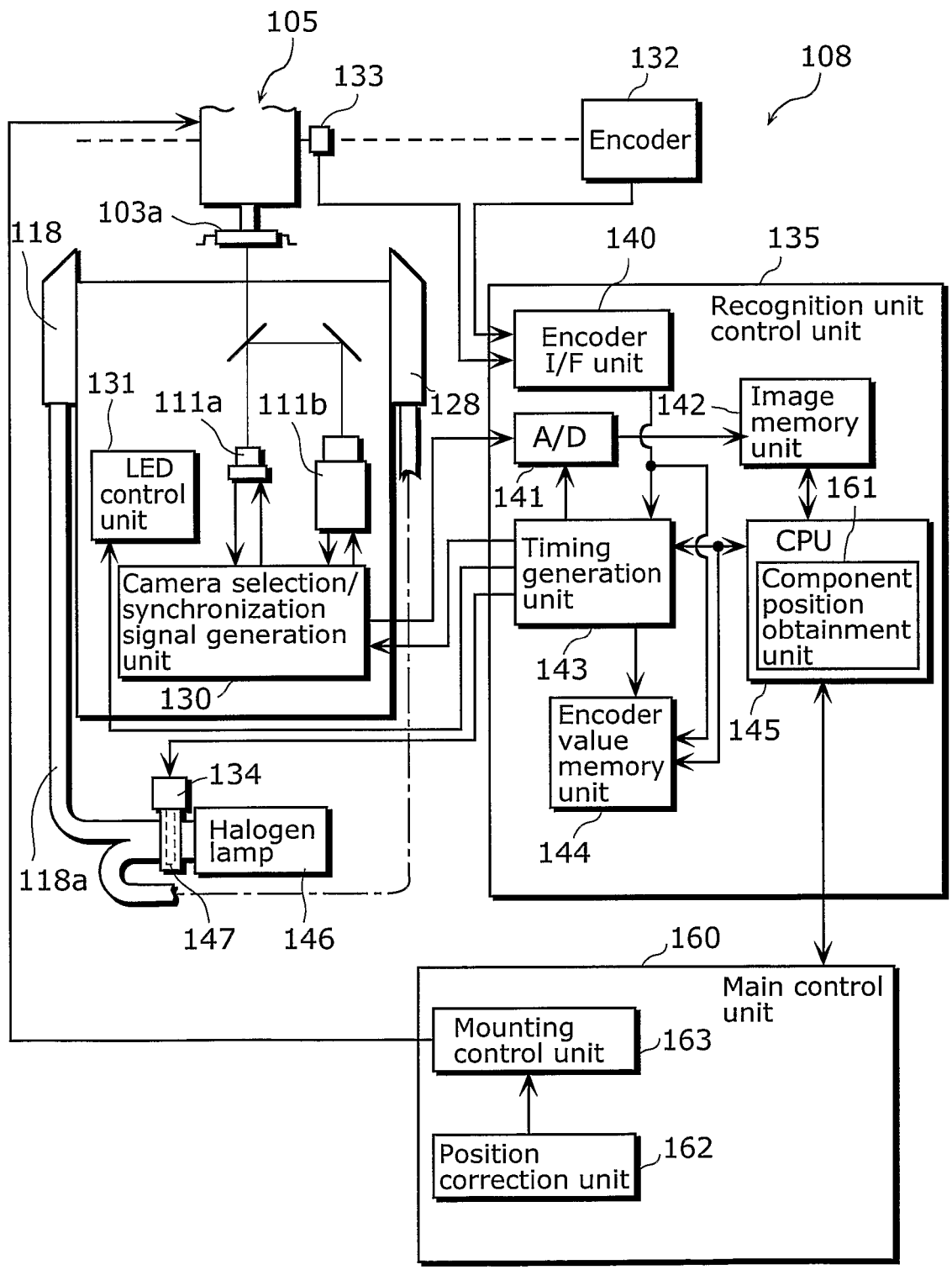
FIG. 7 is a functional block diagram showing the recognition unit.

FIG. 7 is a functional block diagram showing the recognition unit 108.

The recognition unit 108 includes a camera selection/synchronization signal generation unit 130, a LED control unit 131, a driving unit 134, and a recognition unit control unit 135.

The camera selection/synchronization signal generation unit 130 selects one of the line camera 111*a* and the shutter camera 111*b* by which an image should be taken, generates a synchronization signal, and outputs, to the recognition unit control unit 135, an image signal from one of the line camera 111*a* and the shutter camera 111*b* which has been selected.

The LED control unit 131 outputs a lighting signal to the lighting control circuit 113*a* that controls the lighting of the LEDs 113*a*.

The driving unit 134 drives a mechanical shutter 147 so as to determine whether to guide the light of the halogen lamp 146 to the optical fibers 118*a*.

The recognition unit control unit 135 includes an encoder I/F unit 140, an analogue-to-digital (AD) conversion unit 141, an image memory unit 142, a timing generation unit 143, an encoder value memory unit 144, and a CPU 145.

Inputted to the encoder I/F unit 140 are an encoder signal from the encoder 132 and a Z phase signal from the position detection sensor 133. Here, the encoder 132 functions as a movement obtainment unit that obtains a movement amount of the mounting head 105 in the X direction, and the position detection sensor 133 functions as an instruction unit that detects that the mounting head 105 has arrived at a position at which the recognition unit 108 starts the recognition of the component 103*a* (such position is hereinafter referred to as a "recognition start position"), and that instructs the recognition unit control unit 135 to start taking an image of the component 103*a*. To be more specific, the detection performed by the position detection sensor 133 refers to (i) detecting the present position of the mounting head 105 based on the travel distance of the mounting head 105 that is obtained from the encoder signal from the encoder 132, and detecting that the component picked up by the mounting head 105 has entered the filed of view of the recognition unit 108, and (ii) detecting by an optical sensor or other sensors that the component picked up by the mounting head 105 has come above the recognition unit 108. Note that the detection by the position detection sensor 133 is not limited to the detection by the above-mentioned units, as long as it is possible to detect that the mounting head 105 has arrived at the recognition start position.

The AD conversion unit 141 performs an AD conversion of image data which is obtained by a selected one of the line camera 111a and the shutter camera 111b and which is transferred from the camera selection/synchronization signal generation unit 130.

The image memory unit 142 stores the AD converted image data.

The timing generation unit 143 generates various timing signals depending on signals and instructions from the encoder I/F unit 140 and the CPU 145, and outputs the generated timing signals to the camera selection/synchronization single generation unit 130, the LED control unit 131, the driving unit 134, the AD conversion unit 141, and the encoder value memory unit 144.

The encoder value memory unit 144 stores: an encoder value indicating a movement amount by which the mounting head 105 moves during a time period from the output of a Z phase signal to the start of the camera exposure by the shutter camera 111b; and an encoder value indicating a movement amount by which the mounting head 105 moves during a time period from the output of the Z phase signal to the end of the camera exposure by shutter camera 111b.

The CPU 145 functions as a component position obtainment unit 161 that obtains component position data, where the component position obtainment unit 161 reads the encoder values from the encoder value memory unit 144, and obtains component position data based on the image data stored in the image memory unit 142 and the readout encoder values (the movement amount of the mounting head 105). The CPU 145 outputs, to the main control unit 160 that controls the whole of the mounter 101, the component position data, together with the image data stored in the image memory unit 142. Furthermore, the CPU 145 receives, from the main control unit 160, an operation instruction as well as data concerning the type of the component 103a. Here, the main control unit 160 includes: a position correction unit 162 that corrects the mounting position of the component 103a, based on the obtained component position data; and a mounting control unit 163 that controls the mounting head 105 so that the component 103a is mounted at the corrected mounting position.

Figure 8:
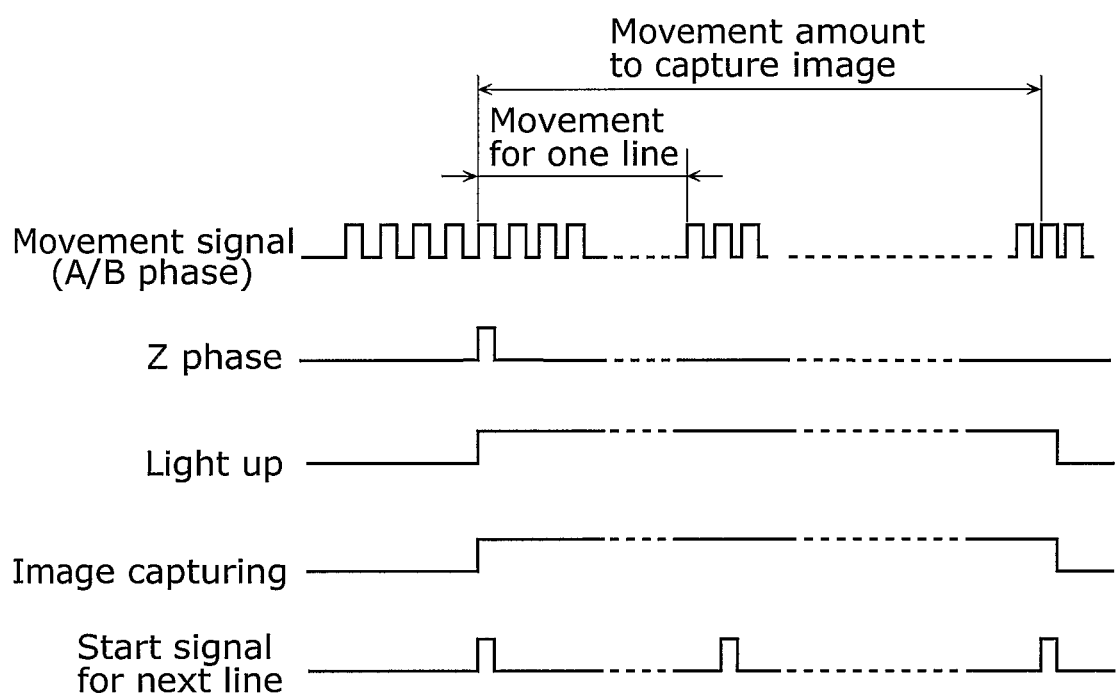
FIG. 8 is a timing chart showing operations performed by the recognition unit for recognizing a component performed (in the case of mounting a large-sized component onto a board)
Figure 9:
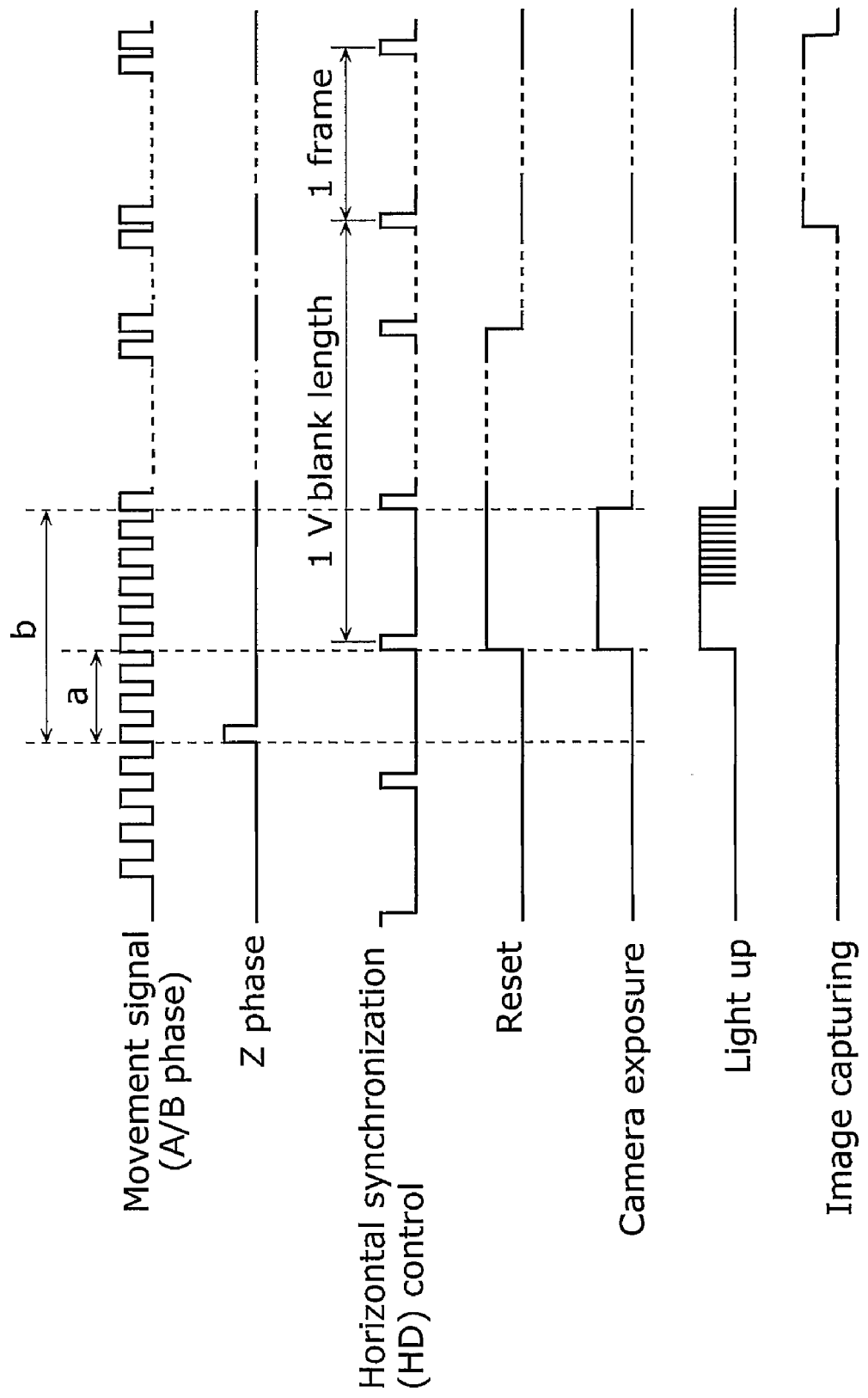
FIG. 9 is a timing chart s showing operations performed by the recognition unit for recognizing a component (in the case of mounting a small-sized component onto a board)
Figure 10:
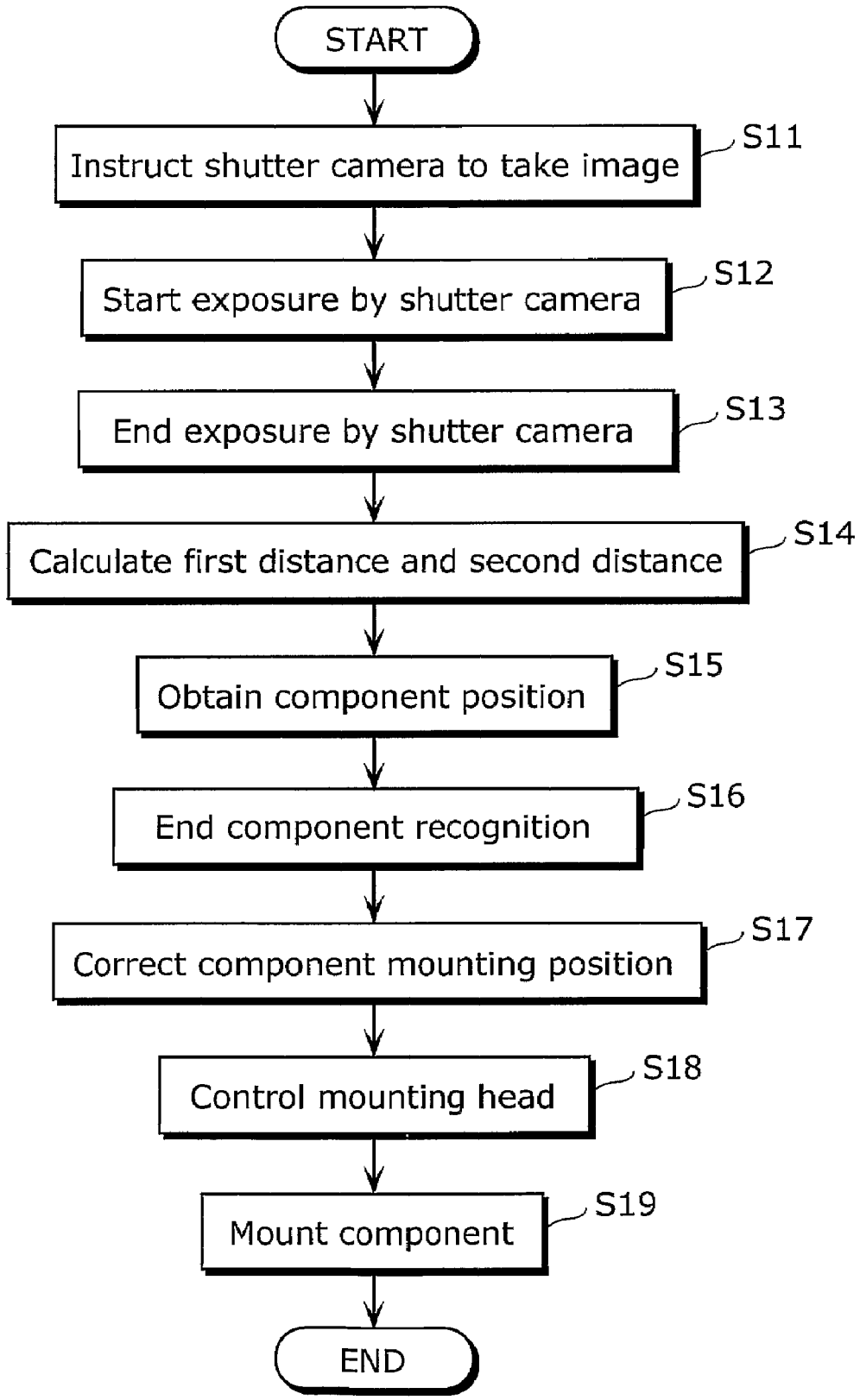
FIG. 10 is a flowchart for describing operations for mounting a component (in the case of mounting a small-sized component onto a board)

Next, a description is given of operations for mounting a component 103a performed by the mounter 101 with the above structure. FIG. 8 is a timing chart showing recognition operations performed by the recognition unit 108 in the case of mounting a large-sized component 103a onto a board 102a. FIG. 9 is a timing chart showing recognition operations performed by the recognition unit 108 in the case of mounting a small-sized component 103a onto a board 102a. FIG. 10 is a flowchart showing mounting operations in the case of mounting a small-sized component 103a onto a board 102a.

In the case of mounting a large-sized component 103a onto a board 102a, the main control unit 160 inputs, to the CPU 145, information indicating that a component subjected to recognition is a large-sized component 103a. Upon receipt of the information, the CPU 145 instructs the timing generation unit 143 to output a timing signal intended for the case where an image is taken by the line camera 111a. When the mounting head 105 arrives at the recognition start position of the recognition unit 108, the position detection sensor 133 outputs a Z phase signal for instructing the line camera 111a to start taking an image of the component 103a, and the recognition unit 108 starts the recognition of the component 103a.

In response to the output of the Z phase signal, the timing generation unit 143 outputs a start signal to the line camera 111a. In response to this start signal, the line camera 111a starts the camera exposure, and an image for the first line is captured. At the same time, in response to the output of the Z phase signal, the timing generation unit 143 outputs, to the LED control unit 131, a lighting signal intended for the case where recognition is performed by the line camera 111a.

Then, when detecting, based on the encoder signal, that the mounting head 105 has moved over a distance equivalent to one line in the image after the output of the Z phase signal, the timing generation unit 143 outputs a start signal for starting the next scanning. In response to this start signal, an image for the next line is captured.

At the completion of the movement over the distance which is necessary to capture the whole image of the component 103a after repetitively performing the above operations, the next start signal is outputted to end the camera exposure by the line camera 111a and to turn off the LEDs 113a. Then, the CPU 145 outputs, to the main control unit 160, the image data taken by the line camera 111a as an imaging result, and causes the recognition unit 108 to end the recognition of the component 103a.

Finally, the main control unit 160 corrects the mounting position of the component 103a, based on the image data obtained through the recognition by the recognition unit 108. Then, the mounting head 105 mounts the component 103a at the corrected mounting position.

Figure 11:
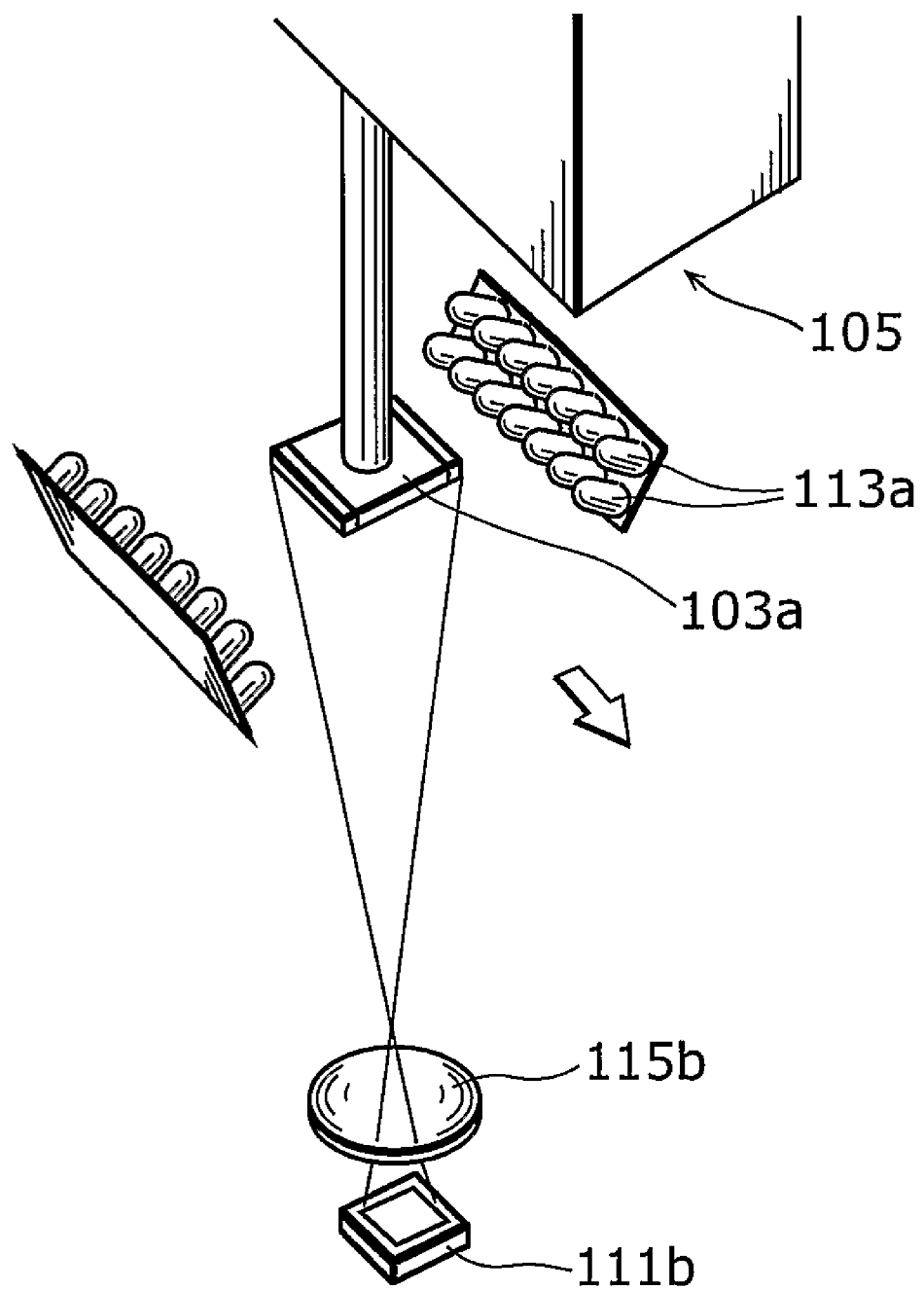
FIG. 11 is a perspective view schematically showing a shutter camera taking an image.

Meanwhile, in the case of mounting a small-sized component 103a onto a board 102a, the main control unit 160 inputs, to the CPU 145, information indicating that a component subjected to recognition is a small-sized component 103a. Upon receipt of the information, the CPU 145 instructs the timing generation unit 143 to output a timing signal intended for the case where an image is taken by the shutter camera 111b. When the mounting head 105 arrives at the recognition start position of the recognition unit 108, the position detection sensor 133 outputs a Z phase signal for instructing the shutter camera 111b to start taking an image of the component 103a, and the recognition unit 108 starts the recognition of the component 103a (Step S11). In other words, as shown in FIG. 11, when the component 103a enters the field of view of the focusing point of the shutter camera 111b, an instruction to start taking an image is outputted to the shutter camera 111b.

In response to the output of the Z phase signal, the timing generation unit 143 outputs, to the shutter camera 111b, a reset signal (which is directed to vertical synchronization) in synchronization with a horizontal synchronization control signal. In response to the output of this reset signal, the shutter of the shutter camera 111b opens, and the camera exposure by the shutter camera 111b starts (Step S12). The shutter of the shutter camera 111b closes after a predetermined lapse of time (camera exposure time) from when it opens (Step S13). At the same time, in response to the output of the Z phase signal, the timing generation unit 143 outputs, to the LED control unit 131, a lighting signal intended for the case where recognition is performed by the shutter camera 111b. At this time, the encoder value memory unit 144 stores: an encoder value indicating a movement amount by which the mounting head 105 moves during a time period from the output of the Z phase signal to the output of the horizontal synchronization control signal (the encoder value corresponding to the range "a" in FIG. 9); and an encoder value indicating a movement amount by which the mounting head 105 moves during a time period from the output of the Z phase signal to the end of the camera exposure by the shutter camera 111b (the encoder value corresponding to the range "b" in FIG. 9). Note that the timing generation unit 143 may output, to the driving unit 134, a signal for causing the mechanical shutter 147 to open at the same time when the timing generation unit 143 outputs the lighting signal to the LED control unit 131.

Then, after a lapse of time (one vertical blank period (1V blank length)) equivalent to a time period until the first horizontal synchronization signal is outputted after the reset operation duration (which is the time required to perform a reset operation including the time required for shutter on and off of the camera, and is normally in the range between one to several HD (horizontal synchronization signals) depending on the type of the camera), an image of one frame is captured in synchronization with such horizontal synchronization control signal.

Figure 12A:
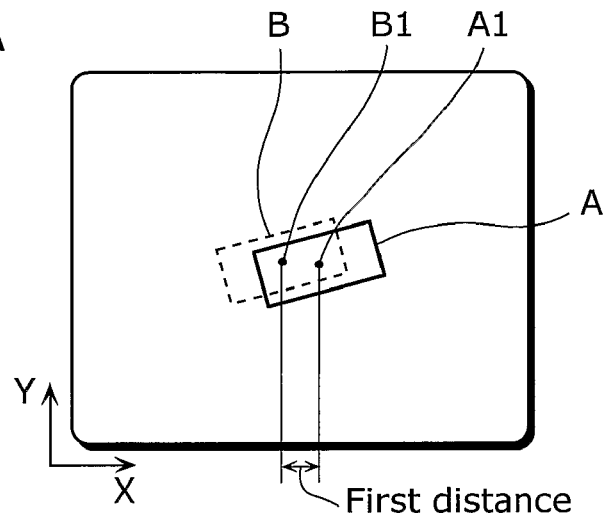
FIG. 12A is a diagram for describing a method of correcting the mounting position of a component.
Figure 12B:
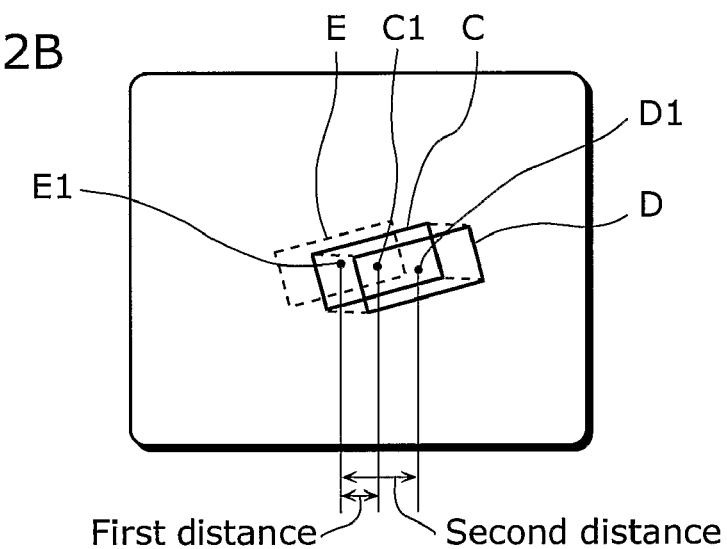
FIG. 12B is a diagram for describing a method of correcting the mounting position of a component.
Figure 12C:
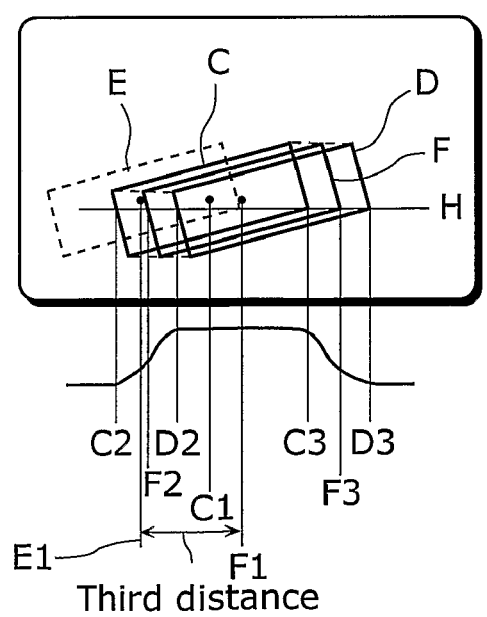
FIG. 12C is a diagram for describing a method of correcting the mounting position of a component.

Then, based on the encoder values stored in the encoder value memory unit 144, the CPU 145 calculates the following two distances: a first distance over which the mounting head 105 moves during a time period from the output of the Z phase signal to the start of the camera exposure by the shutter camera 111b; and a second distance over which the mounting head 105 moves during a time period from the output of the Z phase signal to the end of the camera exposure by the shutter camera 111b (Step S14). Then, the component position obtainment unit 161 in the CPU 145 obtains component position data, based on the first distance and the image data taken by the shutter camera 111b (Step S15). To be specific, based on the first distance, the component position obtainment unit 161 corrects the position of the component shown in the image which is obtained as a result of the recognition. To be more specific, in the case where the start and the end of the camera exposure is almost the same in timing, referring to FIG. 12A, the component position is corrected by shifting the component position A1 shown in the component image (which is the component image A in FIG. 12) taken by the camera by the first distance in the moving direction of the component 103a (in the X direction in FIG. 12A), so as to regard the component position as the component position B1 shown in the component image (which is the component image B in FIG. 12A, and does not exist in actuality) as of the time when the Z phase signal is outputted. In the case where there is a time lag between the start and the end of the camera exposure, referring to FIG. 12B, the component position is corrected in the following manner: obtain, from the component image taken by the camera, the component position C1 shown in the component image (which is the component image C in FIG. 12B) as of the start of the camera exposure and the component position D1 shown in the component image (which is the component image D in FIG. 12B) as of the end of the camera exposure; correct the component position (i) by shifting the component position C1 shown in the component image as of the start of the camera exposure by the first distance in the moving direction of the component 103a (in the X direction in FIG. 12B), so as to regard the component position as the component position E1 shown in the component image (which is the component image E in FIG. 12B, and does not exist in actuality) as of the time when the Z phase signal is outputted, or (ii) by shifting the component position D1 shown in the component image as of the end of the camera exposure by the second distance in the moving direction of the component 103a (in the X direction in FIG. 12B), so as to regard the component position as the component position E1 shown in the component image (which is the component image E in FIG. 12B, and does not exist in actuality) as of the time when the Z phase signal is outputted. Note that the component position may also be corrected, using the average value between the component position E1 obtained by the correction that is based on the component position C1 as of the start of the camera exposure and the component position E1 obtained by the correction that is based on the component position D1 as of the end of the camera exposure. The use of the average value enables a further accurate position correction. Also note that when it is not easy to obtain the component image C as of the start of the camera exposure and the component image D as of the end of the camera exposure, a component position may be obtained from an image, which is an overlap of the successively obtained component images C and D shown in FIG. 12B and which is thus distorted in shape, so as to correct such obtained component position. In this case, a luminous distribution in such distorted image is checked, so as to obtain the points where a change in brightness is the largest (the points indicating the steepest rise and drop). Then, as the contour of the distorted image is determined by connecting such obtained points, and the component position is obtained from the obtained contour. For example, in the case where a distorted image as shown in FIG. 12C is obtained, and the brightness distribution (at the position indicated by the line H in FIG. 12C) of such distorted image is the one as shown in FIG. 12C, the component position is corrected in the following manner: extract F2 and F3, which are the points where rise and drop in brightness is the largest; extract the component position F1 in the contour F of the component image obtained by scanning the line H; obtain, as a third distance, the amount of shift from the component position F1 to the recognition start position (which is the component position as of the output of the Z phase signal); and shift the component position F1 by the third distance in the moving direction of the component 103a, so as to regard the component position as the component position E1 shown in the component image (which is the component image E in FIG. 12B) as of the output of the Z phase signal. The third distance is calculated, for example, in the following manner: by determining the distance ratio between C2 and F2 with respect to the distance between C2 and D2, where C2 is the point where the rise in the brightness starts and D2 is the point where the rise in the brightness ends; and then by multiplying the determined ratio with the distance between the component position C1 and the component position D1.

Then, the CPU 145 outputs the image data and the component position data to the main control unit 160, which controls the whole of the mounter 101, and causes the recognition unit 108 to end the recognition of the component 103a (Step S16).

Finally, the position correction unit 162 corrects the mounting position of the component 103a based on the amount of displacement between the obtained component position and the correct component position (Step S17), and the mounting control unit 163 controls the mounting head 105 so that the mounting head 105 mounts the component 103a at such corrected mounting position (Step S18). The mounting head 105 mounts the component 103a at the corrected mounting position under the control of the mounting control unit 163 (Step S19).

As described above, according to the mounter of the present embodiment, a component position shown in an image taken by the shutter camera is corrected based on a travel distance over which the mounting head moves during a time period from when the mounting head arrives at the recognition start position to when the camera exposure by the shutter camera is performed (e.g., a first distance over which the mounting head moves by the time when the camera exposure by the shutter camera is started). This makes it possible to correctly recognize, by use of the recognition unit, the state of a component held on the mounting head, and thus to correct the mounting position of the component with high accuracy.

Furthermore, according to the mounter of the present embodiment, the component position in a component image obtained during a time period between the start and the end of the camera exposure, is corrected based on one of the above-described first distance, second distance, and third distance. This makes it possible to shorten the time required by the recognition unit to recognize the component as well as to reduce the cycle time, since it is possible for the recognition unit to start the recognition even when the component moves at an accelerated speed, without needing to wait for such component to move at a constant speed.

Furthermore, according to the mounter of the present embodiment, one of the shutter camera and the line camera is selected depending on the size of a component, and an image of the component is taken by use of the selected camera. This makes it possible to perform component recognition with high accuracy, regardless of the size of components.

Although only an exemplary embodiment of this invention has been described in detail above, those skilled in the art will readily appreciate that many modifications are possible in the exemplary embodiment without materially departing from the novel teachings and advantages of this invention. Accordingly, all such modifications are intended to be included within the scope of this invention.

For example, in the mounter of the above-described embodiment, although the recognition unit has a shutter camera and a line camera, so as to selectively use one of these cameras depending on the size of components, the recognition unit may have only the shutter camera and use the shutter camera at all time regardless of the size of components.

For example, in the mounter of the above-described embodiment, although the shutter camera of the recognition unit is a CCD camera, the present invention is not limited to this as long as the shutter camera is an electronic shutter camera capable of obtaining two-dimensional image by one shot, and thus the shutter camera of the recognition unit may be a MOS camera.

Moreover, in the mounter of the above-described embodiment, although the timing generation unit outputs a reset signal at the timing when the first horizontal synchronization control signal is outputted after the output of a Z phase signal, that is, the timing generation unit outputs a reset signal based on the output of a Z phase signal and a horizontal synchronization control signal. However, the timing generation unit may output a reset signal based on the Z phase signal and on the distance over which the mounting head moves after the output of the Z phase signal and the horizontal synchronization control signal. In this case, the timing generation unit first recognizes that the Z phase signal is outputted and that the mounting head has moved over a predetermined distance after the output of the Z phase signal, based on an encoder signal, and then outputs the reset signal when the horizontal synchronization control signal is outputted.

Furthermore, in the mounter of the above-described embodiment, although the main control unit has the position correction unit, the present invention is not limited to this. For example, the recognition unit may have the position correction unit.

Furthermore, in the mounter of the above-described embodiment, the component position obtainment unit corrects the position of a component shown in an image taken by the shutter camera, based on the first distance or the second distance. However, the component position obtainment unit may correct the position of a component shown in an image taken by the shutter camera, based on one of the following in addition to the first distance and the second distance: a first time, which is a time period from the output of a Z phase signal to the start of the camera exposure by the shutter camera; and a second time, which is the a time period from the output of the Z phase signal to the end of the camera exposure by the shutter camera. In this case, the first time and the second time are derived from, for example, an encoder signal, and such derived first time and second time are stored into the encoder value memory unit. This structure allows for a highly accurate image correction as well as for a highly accurate correction of a mounting position of a component.

Furthermore, in the mounter of the above-described embodiment, although the position of a component shown in an image taken by a camera is obtained, and such obtained component position is corrected, the present invention is not limited to this. For example, an image taken by a camera may be corrected as (shifted to) an image as of the output of the Z phase signal, and the position of the component shown in such corrected image may be obtained.

Furthermore, in the mounter of the above-described embodiment, the component position obtained from an image taken by a camera is shifted to the recognition start position, and the amount of displacement between such shifted component position and the central nozzle position (which is at the recognition start point and is located at the center of the camera's field of view) is calculated. However, the present invention is not limited to this, and thus the central nozzle position at the recognition start point (the center of the camera's field of view) may be shifted by the first distance, the second distance, or the third distance, and the amount of displacement may be calculated between such shifted central nozzle position and the component position obtained from the component image.

Furthermore, in the mounter of the above-described embodiment, although a travel distance over which the mounting head moves during a time period from when an instruction to start taking an image is given to when camera exposure is performed, is obtained, and the first distance, second distance, and third distance are described as examples of such travel distance, the present invention is not limited to this, and thus the travel distance may be any distances as long as it indicates a travel distance over which the mounting head moves during a time period from when an instruction to start taking an image is given to when camera exposure is performed.

INDUSTRIAL APPLICABILITY

The present invention is applicable for use as a component mounting method and a mounter, and particularly as a component mounting method, a mounter, and the like for correcting a mounting position of a component at the time of component mounting.

The invention claimed is:

1. A component mounting method for use by a mounter having a mounting head that holds and moves a component so as to mount the component onto a board, said method comprising:
giving an instruction for a camera to start taking an image of the component held on the mounting head, based on a position of the mounting head;
starting camera exposure by the camera in response to the instruction;
obtaining a movement amount by which the mounting head moves during a time period from when the instruction is given to when the camera exposure is performed;

obtaining a position of the component based on the movement amount and the image taken by the camera;

correcting a mounting position at which the mounting head is to mount the component, based on the obtained position of the component; and mounting the component, whose image has been taken by the camera, at the corrected mounting position.

2. The component mounting method according to claim 1, wherein in said obtaining of the position of the component, the position of the component shown in the image is corrected based on the movement amount.

3. The component mounting method according to claim 1, wherein in said obtaining of the movement amount, a first distance is obtained over which the mounting head moves during a time period from when the instruction is given to when the camera exposure is started, and in said obtaining of the position of the component, the position of the component is obtained based on the first distance and the image taken by the camera.

4. The component mounting method according to claim 1, further comprising ending the camera exposure after a predetermined lapse of time from when the camera exposure is started, wherein in said obtaining of the movement amount, a second distance is obtained over which the mounting head moves during a time period from when the instruction is given to when the camera exposure is ended, and in said obtaining of the position of the component, the position of the component shown in the image taken by the camera is corrected based on the second distance.

5. The component mounting method according to claim 1, further comprising ending the camera exposure after a predetermined lapse of time from when the camera exposure is started, wherein in said obtaining of the movement amount, a first distance and a second distance are obtained, the first distance being a distance over which the mounting head moves during a time period from when the instruction is given to when the camera exposure is started, and the second distance being a distance over which the mounting head moves during a time period from when the instruction is given to when the camera exposure is ended, and in said obtaining of the position of the component, the position of the component shown in the image taken by the camera is corrected based on the first distance and the second distance.

6. The component mounting method according to claim 1, further comprising ending the camera exposure after a predetermined lapse of time from when the camera exposure is started, wherein said obtaining of the movement amount includes:

obtaining brightness distribution in images of the component taken by the camera, the images ranging from the start to the end of the camera exposure; and obtaining a contour of the component from the brightness distribution, and obtaining a third distance over which the mounting head moves during a time period from when the instruction is given to when the component arrives at a position of the contour, and in said obtaining of the position of the component, the position of the component shown in the image taken by the camera is corrected based on the third distance.

\* \* \* \* \*

UNITED STATES PATENT AND TRADEMARK OFFICE
CERTIFICATE OF CORRECTION

PATENT NO. : 7,581,313 B2
APPLICATION NO. : 11/667334
DATED : September 1, 2009
INVENTOR(S) : Eiichi Hachiya et al.

It is certified that error appears in the above-identified patent and that said Letters Patent is hereby corrected as shown below:

On the cover page,
In item (86) PCT No.
Replace "PCT/JP2006/004677" with --PCT/JP2006/304677--.

Signed and Sealed this

Thirtieth Day of March, 2010

David J. Kappos
*Director of the United States Patent and Trademark Office*